United States Patent [19]

Kapoor

[11] Patent Number: 5,780,347
[45] Date of Patent: Jul. 14, 1998

[54] METHOD OF FORMING POLYSILICON LOCAL INTERCONNECTS

[76] Inventor: Ashok K. Kapoor, 1056 Amarillo Ave., Palo Alto, Calif. 94303

[21] Appl. No.: 650,476

[22] Filed: May 20, 1996

[51] Int. Cl.$^6$ .................................. H01L 21/336
[52] U.S. Cl. .................. 438/301; 438/766; 438/764; 438/918; 438/966; 438/162; 438/165; 438/491; 438/528; 438/532; 438/659
[58] Field of Search .................. 437/186, 34, 50, 437/69, 40 R, 41 R; 438/301, 766, 764, 918, 966, 162, 165, 491, 528, 532, 659

[56] References Cited

U.S. PATENT DOCUMENTS

| | | | |
|---|---|---|---|
| 3,634,203 | 1/1972 | McMahon | 204/15 |
| 3,775,262 | 11/1973 | Heyerdahl | 204/15 |
| 3,966,501 | 6/1976 | Nomura et al. | 148/1.5 |
| 4,143,178 | 3/1979 | Harada | 427/85 |
| 4,356,211 | 10/1982 | Riseman | 427/85 |
| 4,818,711 | 4/1989 | Choksi et al. | 438/528 |
| 5,219,768 | 6/1993 | Okita | 437/34 |
| 5,252,517 | 10/1993 | Blalock et al. | 437/195 |
| 5,269,877 | 12/1993 | Bol | 156/628 |
| 5,393,676 | 2/1995 | Anjum et al. | 438/981 |
| 5,460,983 | 10/1995 | Hodges et al. | 438/152 |
| 5,682,052 | 10/1997 | Hodges et al. | 257/377 |

Primary Examiner—Charles L. Bowers, Jr.
Assistant Examiner—Lynne A. Gurley
Attorney, Agent, or Firm—Fenwick & West LLP

[57] ABSTRACT

A method and apparatus of forming local interconnects in a MOS process deposits a layer of polysilicon over an entire region after several conventional MOS processing steps. The region is then masked to provide protected regions and unprotected regions. The mask may be used to define local interconnects and other conductive elements such as the source and drain contact regions for a MOS transistor. After masking, the region is bombarded with atoms to enhance the oxidation potential of the unprotected regions. The masking is removed and the substrate is then exposed to oxidizing conditions which cause the unprotected regions to rapidly oxidize to form a thick oxide layer. The formerly protected polysilicon regions may then be doped to render them conductive. The method reduces the number of steps required for formation of local interconnects, permits self-planarization, and avoids excessive etching of polysilicon during the formation of the various conductive regions in a structure that includes source and drain electrodes and local interconnects within the commonly-prepared layer of conductive polysilicon.

7 Claims, 8 Drawing Sheets

METHOD OF FORMING POLYSILICON LOCAL INTERCONNECTS

FIELD OF THE INVENTION

This invention relates generally to the processing of integrated circuits and more particularly to a method of forming a local interconnect in a metal oxide semiconductor (MOS) manufacturing process.

BACKGROUND OF THE INVENTION

Conventional integrated circuit technology uses a planar process wherein several layers are provided for the formation of many individual devices on, for example, a single-crystal chip of silicon. The layers may include conductive, semiconductive, or insulative materials to define the various elements of the integrated circuit devices. Techniques for forming, removing and masking layers and for imparting desired properties to layers or selected regions thereof are implemented to accurately define and form the elements of the devices comprising the integrated circuit. These devices may include, for example, transistors.

To complete the integrated circuit, the individual devices may be interconnected by a conductive path to form a circuit. There are various types of device interconnects. Some encompass relatively long distances. Others merely traverse short distances, such as between two or three adjacent devices and are commonly referred to as local interconnects.

Several process steps may be required to form an element of a device on an integrated circuit. For example, a series of steps may be required for the formation of integrated circuit conductive regions such as the gate electrodes in MOS transistor devices. To form these elements, after several preliminary steps, polysilicon is deposited over a large region. The polysilicon layer is then removed everywhere except for the gate electrode regions which are then doped to render them conductive. This process is deficient in its requirement for excessive etching of polysilicon.

Another problem often presented in semiconductor processing is the need for planarization. The selective formation and removal of layers can create differences in the elevations or thicknesses of a processed semiconductor structure. Large differences in the elevations of the various adjacent surfaces on the semiconductor structure can present difficulties in subsequent processing steps that require a relatively smooth surface. For example, the formation of device interconnects may require a relatively smooth surface. Sometimes, the differences in elevation are extensive enough to require additional steps to smooth the surface of the semiconductor structure. This process is commonly referred to as planarization.

Ordinarily, several independent process steps are used to form local interconnects. For example, after interconnect terminals and pathways are defined, regions may need to be selectively etched to allow for the formation of the interconnects and isolation may need to be established or reestablished as needed to preserve electrical isolation between adjacent components in the layout of the integrated circuit.

Thus, the formation of local interconnects as integrated into other semiconductor processing steps would reduce the number of process steps, would allow for processing without excessive polysilicon etching, and would reduce the need for planarization.

SUMMARY OF THE INVENTION

In accordance with the present invention, local interconnects are formed in conjunction with the formation of other integrated circuit conductive regions, such as the source and drain contact regions of a MOS transistor, to reduce overall process steps, limit polysilicon etching, and accommodate self-planarization.

After several conventional MOS processing steps, a layer of polysilicon is deposited over a region. The region is then masked to provide protected regions and unprotected regions. After masking, the region is bombarded to create damaged regions with enhanced oxidation potential in the unprotected regions. The substrate is then exposed to oxidizing conditions which rapidly oxidizes the polysilicon from the unprotected regions to form a thick oxide layer. During the oxidation period, the protected regions may oxidize only slightly. After removal of any excess oxide from the protected polysilicon regions along with, if desired, a small amount of the thick oxide layer, some planarization is achieved, and the remaining polysilicon structures may be selectively doped. Conventional MOS processing then completes the formation of the integrated circuit.

With appropriate selection of the protected regions, the structure for the local interconnects may be commonly defined and formed with other conductive regions, such as the source and drain contacts regions in a MOS transistor, thereby reducing the number of process steps. Additionally, the formation of certain conductive regions and the thick oxide layer from a common polysilicon layer results in less polysilicon etching. Lastly, the thicknesses of the originally deposited polysilicon layer, the oxidation processes, and the etching of the oxide layers may be properly arranged to achieve substantial self-planarization.

DETAILED DESCRIPTION OF THE INVENTION

Figure 1:
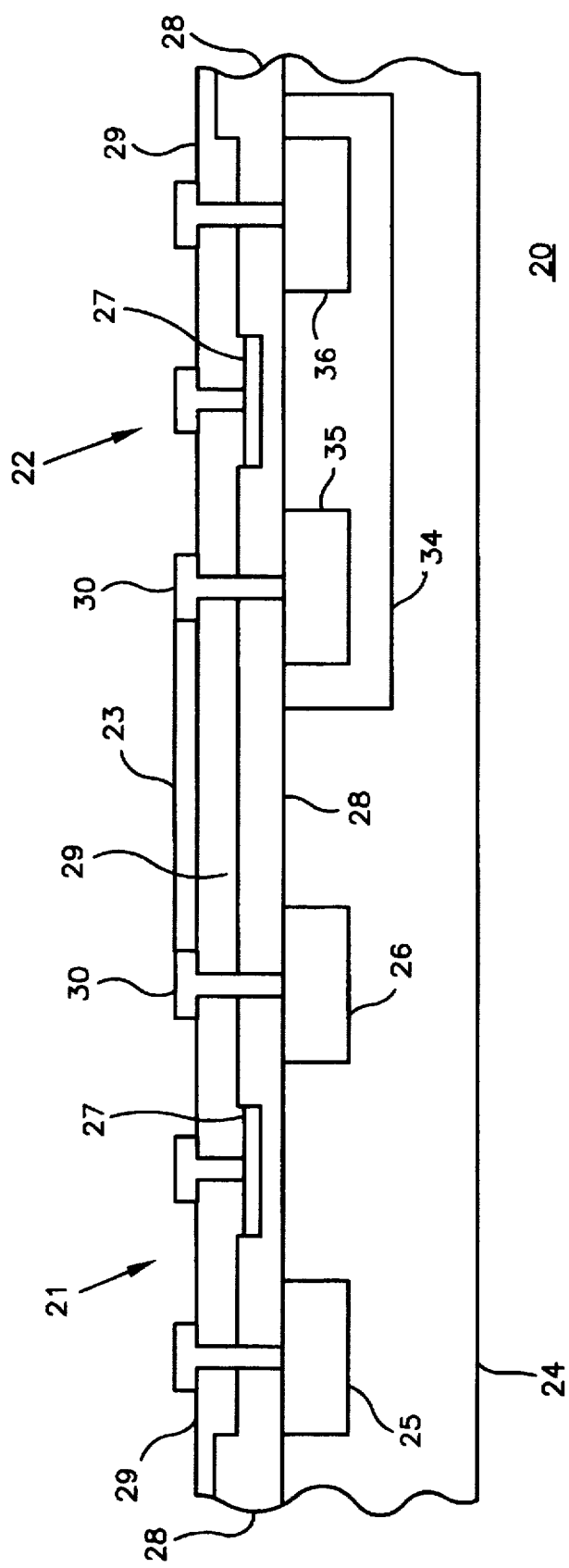
FIG. 1 is a sectional view illustrating conventional device s connected by a local interconnect.

Referring to the sectional view of FIG. 1, an arrangement is shown of an interconnect 23 between an NMOS transistor 21 and a PMOS transistor 22 in a semiconductor structure 20 which includes a p-type substrate 24, an n-type well 34, source 25, 35 and drain 26, 36 regions, and gate electrodes 27. A protective layer 29 covers a thick oxide layer 28 which isolates the various regions. Conventionally, the interconnect 23 traverses the surface of the protective layer 29 between a pair of electrode contacts 30.

Referring, now to the sectional views of FIGS. 2A through 2I, MOS processing on a semiconductor substrate forms diffusion wells and conductive and insulative regions as necessary in the formation of an integrated circuit. Specifically, FIGS. 2A–2I illustrate the structure and the method for forming a local interconnect in a MOS fabrication process. It should be noted, of course, that many devices with many local interconnects may be formed on a semiconductor structure in accordance with the fabrication techniques of the MOS transistors and interconnect as shown and discussed.

Figure 2A:
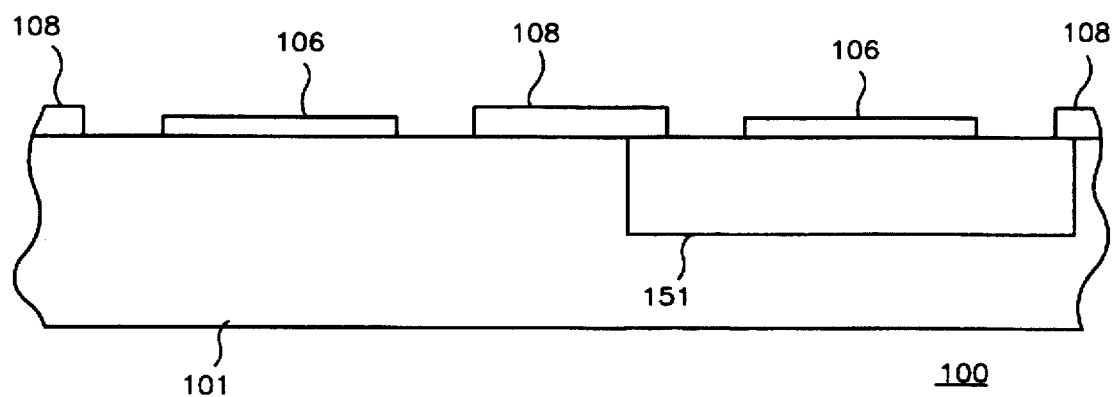
FIGS. 2A–2I are sectional views illustrating the formation of local interconnect structures in the fabrication of MOS transistors in accordance with the present invention.

More specifically, FIG. 2A illustrates a cross-sectional view of a portion of a semiconductor structure 100 including a local p-type substrate 101 and n-type well 151 where two adjacent NMOS 102 and PMOS 103 transistors will be formed. A thin silicon dioxide layer 108 ("thin oxide layer") is formed, using conventional techniques, over the entire surface of the substrate 101 at a thickness of approximately 100–1000 Å. Preferably, using conventional photoresistive masking techniques, the thin oxide layer 108 is selectively etched to remove it from the regions where transistors 102, 103 will be formed and the gate oxide layer 106 is grown to a thickness of approximately 50–200 Å. Finally, again using conventional masking and etching techniques, the gate oxide layer 106 is removed from the source 104 and drain 105 regions. Preferably, the thin oxide layer 108 will not be etched from the areas over which the local interconnects will travel to provide an insulative layer between the interconnect and the substrate 101.

Figure 2B:
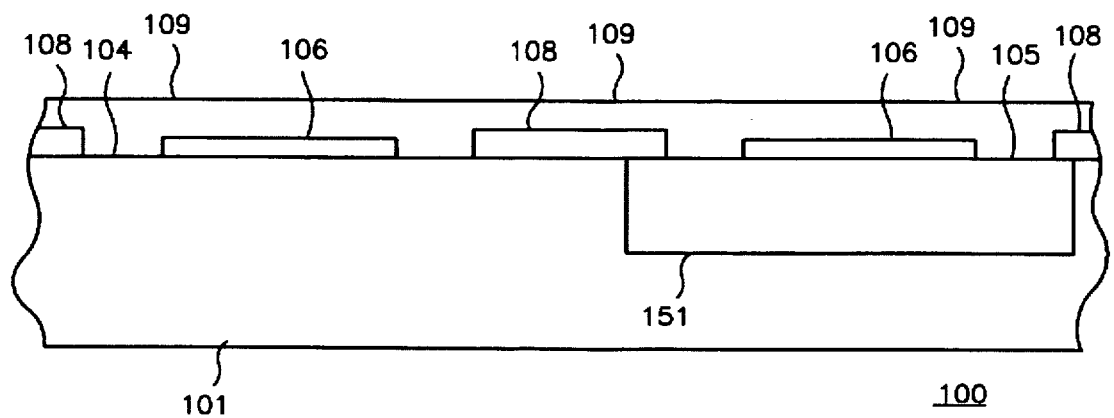
Figure 2C:
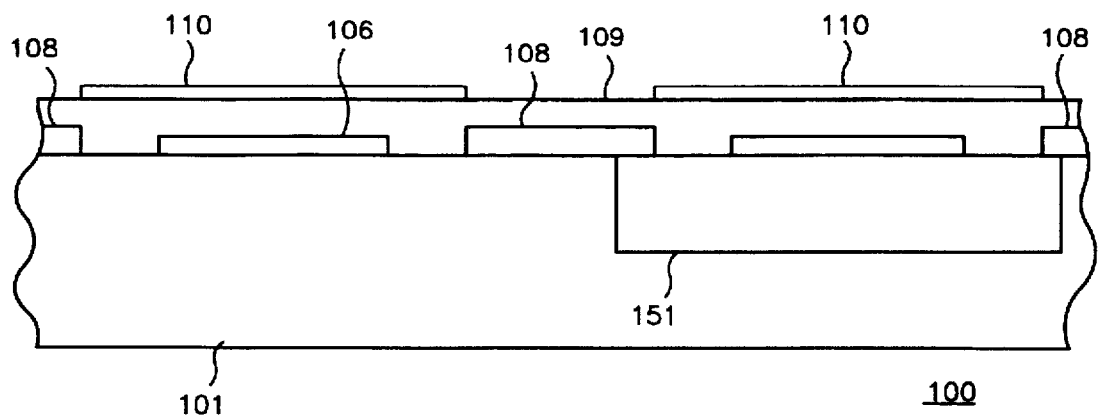

Following the formation of the thin oxide layer 108 and the gate oxide layer 106, a polysilicon layer 109 is formed on the surface, using conventional techniques, as shown in FIG. 2B, for one or more active devices. Preferably, the polysilicon layer will be approximately 500–5000 Å thick. At this stage, the gate electrode regions are typically defined using techniques such as photolithography and all of the excess polysilicon is removed by etching. However, in accordance with the present embodiment, a mask 110 as shown in FIG. 2C is selectively formed over the polysilicon layer 109 to establish protected and unprotected regions in selected locations on the substrate 101. The unprotected regions include regions which will be rendered non-conductive in the following process steps and the protected regions include subregions such as the source and drain contacts and the local interconnects. The mask type and thickness are arranged to adequately protect its underlying regions from subsequent processing such as oxidation enhancement bombardment, and typically will be a photoresistive layer with a thickness of approximately 1–3 micrometers.

Figure 2D:
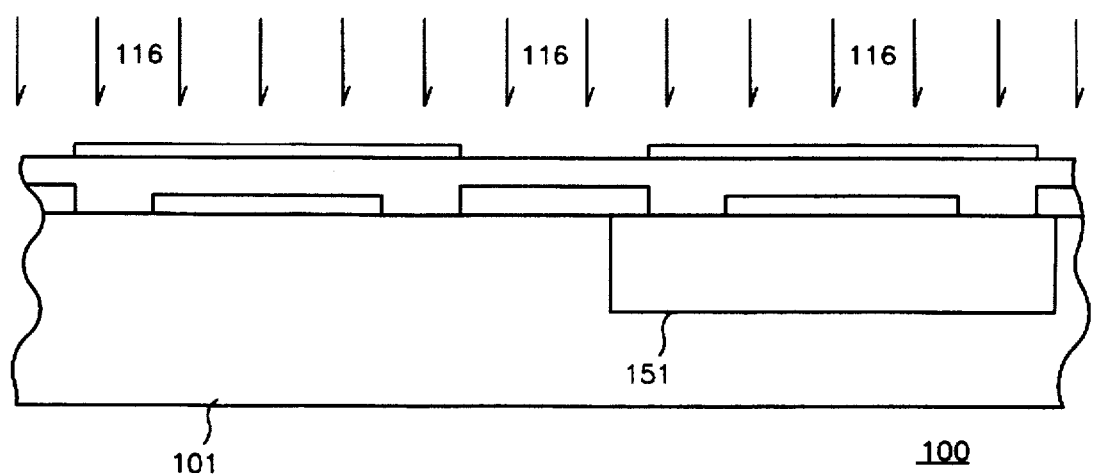

Referring now to the cross-sectional view of FIG. 2D, the surface of the substrate, with appropriate masking 110 in place, is implanted 116 with ions. This bombardment and implantation damages the polysilicon in the exposed areas to enhance its ability to oxidize. In one embodiment, it has been found that implantation with argon ions at energies between about 50 to 500 KeV and a dosage of approximately $5.0 \times 10^{14}$ to $1.0 \times 10^{17}/cm^2$ is most effective for producing regions of enhanced oxidation potential.

Figure 2E:
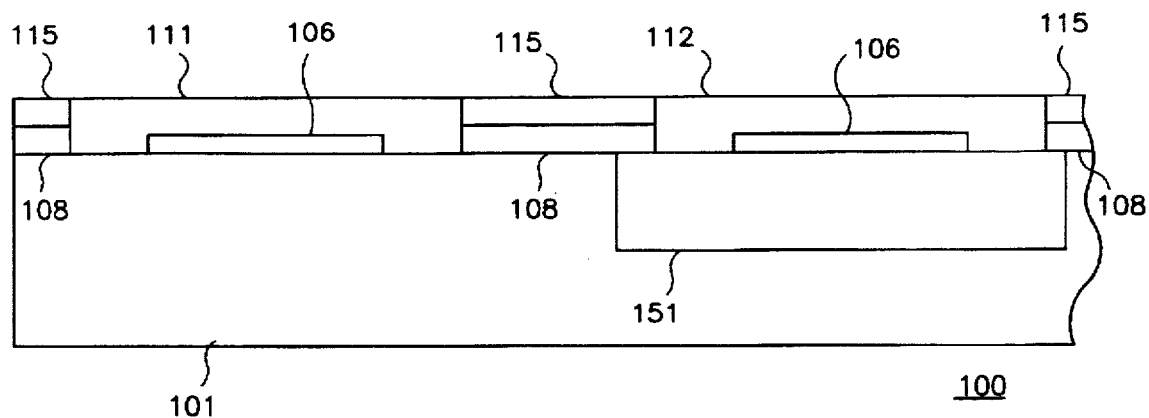

In the preferred embodiment, the mask 110 is then removed from the protected regions, as shown in the cross section of FIG. 2E, to leave protected polysilicon regions corresponding to the transistor islands 111, 112 and the local interconnects 113 with surrounding unprotected polysilicon regions 115 with an enhanced ability to oxidize.

Figure 3A:
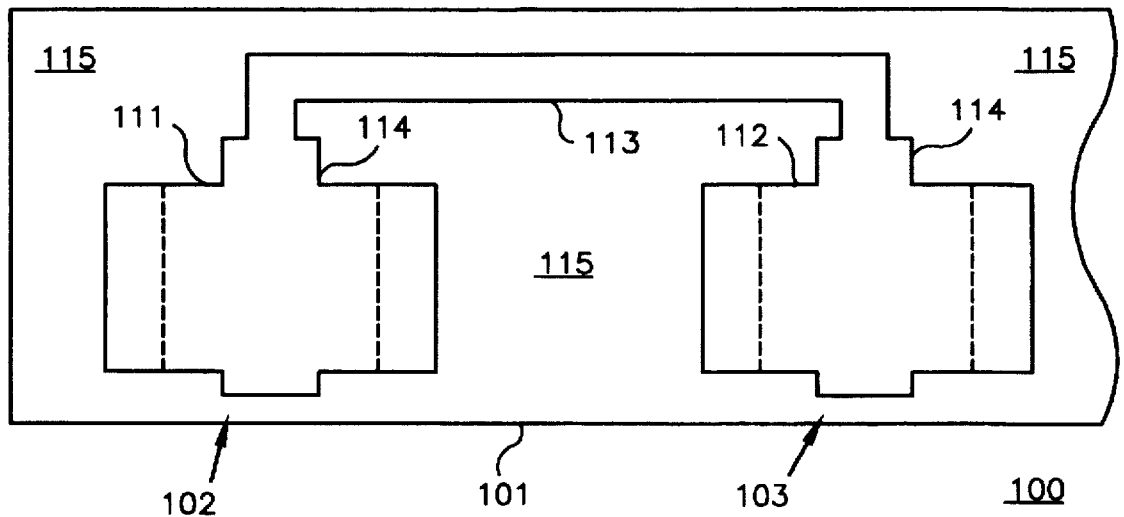
FIGS. 3A–3B are plan views illustrating the formation of local interconnect structures in the fabrication of MOS transistors in accordance with the present invention.

A plan view corresponding to the cross-sectional view of FIG. 2E is shown in FIG. 3A to further illustrate the protected polysilicon regions 111, 112, 113, 114 and unprotected regions with enhanced oxidation potential 115. Specifically, the protected regions correspond to the transistor 102, 103 islands 111, 112 as well as a local interconnect 113 between their gate electrodes 114. In other embodiments, the interconnects may attach a variety of local active or passive elements. After defining the protected 111, 112, 113, 114 and unprotected regions 115, some polysilicon may be etched (not shown) from selected unprotected regions 115, if necessary, to facilitate planarization.

The region is then exposed to conventional oxidizing conditions to produce a thick silicon dioxide layer ("thick oxide layer") 117 in the unprotected regions 115. The unprotected regions 115 will oxidize at a much higher rate than would untreated polysilicon. For example, where polysilicon without atomic bombardment and implantation might take days of exposure at 850° C. to grow a suitably thick oxide layer, the enhanced oxidation regions 115 will form such a layer after exposure to that temperature for approximately 30–300 minutes. Notably, lateral oxidation is substantially avoided by exposure to lower temperatures for a shorter duration. Preferably, conditions are selected to produce a thick (or field) oxide layer 117 of approximately 1000–8000 Å.

Figure 2F:
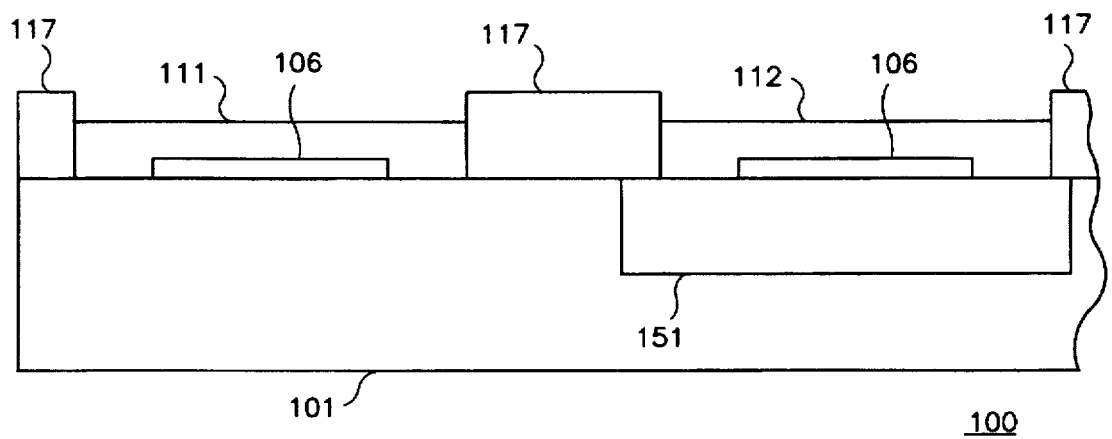

Referring now to FIG. 2F, a cross-section of the semiconductor structure 100 after exposure to oxidizing conditions is shown. As indicated, a thick oxide layer 117 is formed in the exposed polysilicon regions. During oxidation of the unprotected regions, the surface of the protected polysilicon regions 111, 112, 113 may also oxidize slightly (not shown). Removal of the oxide layer may be by selective etching, or, alternatively, by removing a small amount of the thick oxide layer 117 along with the undesired thin oxide layer using conventional (wet or dry) oxide etching techniques.

The remaining thick oxide layer 117 shields the substrate 101 when the regions such as the protected polysilicon regions 111, 112, 113 are treated to render them conductive. Preferably, a mask is provided such that the source, drain and gate regions 111 (including the portion of the gate region 114 shown in FIG. 3A) of the NMOS transistors 102, the gate region 114 (FIG. 3A) of the PMOS transistors 103, and the regions corresponding to the local interconnects 113 (FIGS. 3A, 3B) may be implanted with phosphorus or arsenic at an energy of approximately 40–100 KeV and a dosage of approximately $5.0 \times 10^{14}$ to $5.0 \times 10^{16}/cm^2$ Then, a mask is provided such that the source and drain regions of the PMOS transistors may be implanted with boron or $BF_2$ at an energy of approximately 25–100 KeV and a dosage of approximately $5.0 \times 10^{14}$ to $5.0 \times 10^{16}$. Preferably, the implanted species are then driven into the polysilicon by a thermal diffusion process (approximately 800°–1000° C. for approximately 10 seconds to 60 minutes). Thus, as shown in FIG. 2G the various conductive regions such as the source 118, 158 and drain 119, 159 regions of the transistors 102, 103, the source and drain contact regions, the gate electrode regions, and the local interconnects 113 (FIGS. 3A, 3B) are defined and formed more efficiently and with fewer process steps.

Figure 2G:
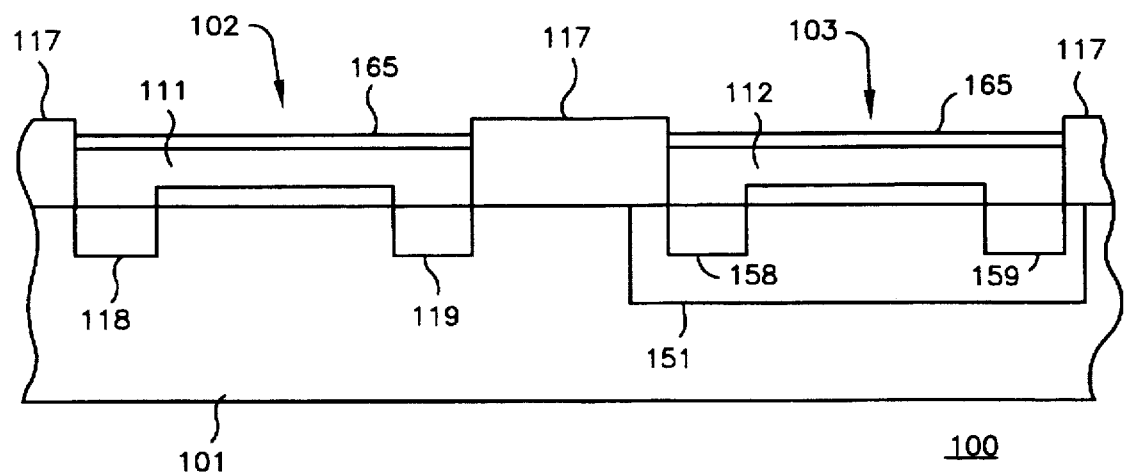

Still referring to FIG. 2G, shown is the semiconductor structure 100 after removal, if necessary, of the slightly oxidized layer at the surface of the protected polysilicon regions 111, 112, 113 and formation of the source 118, 158 and drain 119, 159 regions of the adjacent transistors.

Preferably, after formation of the various conductive regions, a layer of titanium (Ti) is formed over the wafer at a thickness of approximately 100–1000 Å. The region is heated to approximately 700°–900° C. so the titanium reacts with the polysilicon regions to form titanium-silicide over the polysilicon regions. The unreacted titanium is then removed using a conventional solvent based etch so that a layer of conductive titanium-silicide 165 remains in integrated contact with the surface of the polysilicon regions, including the transistor island regions 111, 112 and the local interconnects 113.

Figure 2H:
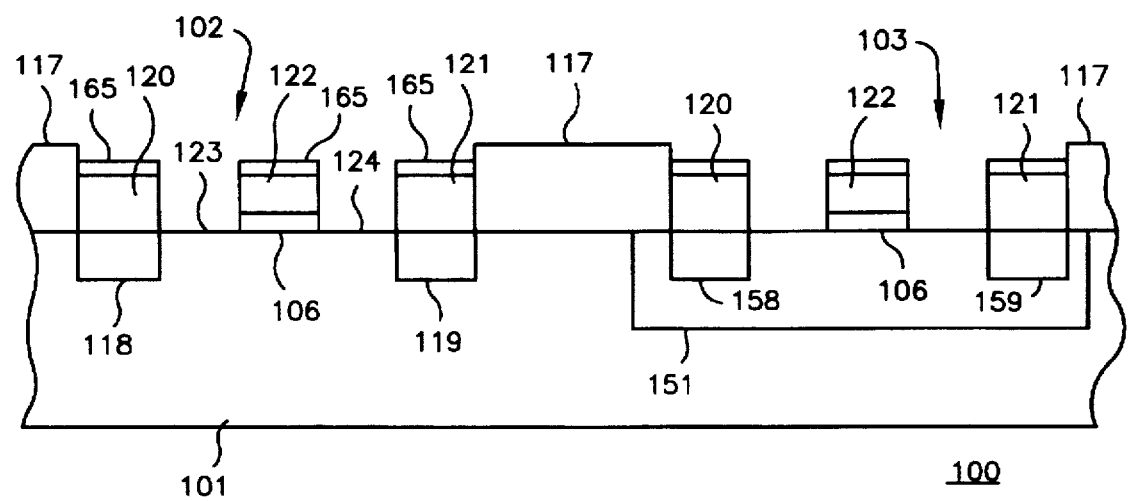

Thereafter, as shown in FIG. 2H, the protected polysilicon regions 111, 112 are selectively etched to define the source 120 and drain 121 contacts and the gate electrodes 122. The gate oxide layer 106 is partially removed to expose the surface of the substrate 123, 124 between the gate electrodes 122 and the source 118, 158 and drain 119, 159 regions of the transistors 102, 103. A portion of the gate oxide layer 106 may remain to prevent shorting between the gate electrodes 122 and the channel between the transistor source and drain regions.

Figure 3B:
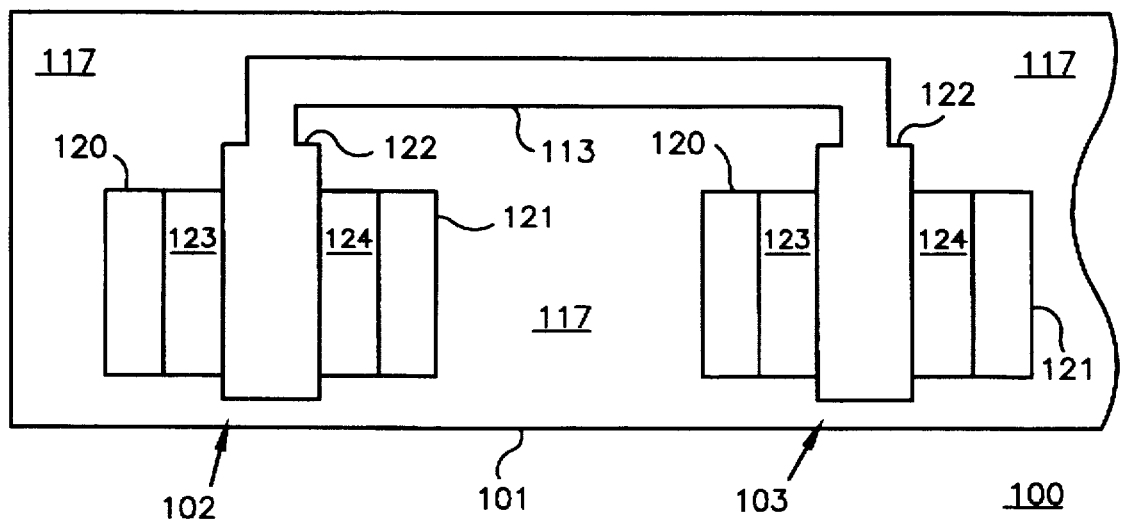

A plan view corresponding to the cross-sectional view of FIG. 2H is shown in FIG. 3B to further illustrate the local interconnect 113 between the gate electrodes 122 of two adjacent transistors 102, 103 on a semiconductor substrate 101. The conductive areas are appropriately isolated by the thick oxide layer 117.

Figure 2I:
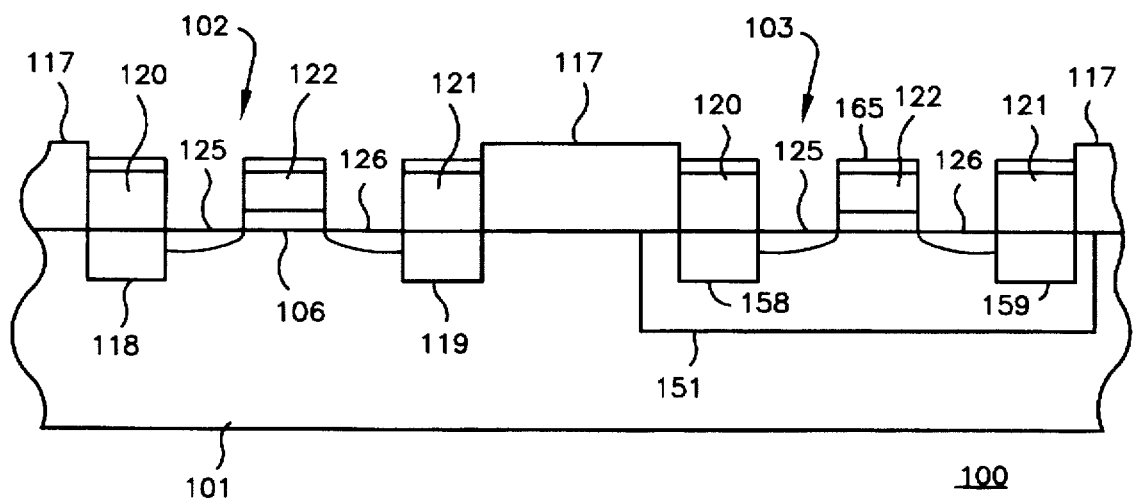

Finally, referencing the cross-sectional view of FIG. 2I, selected regions underlying the surface of the substrate 123, 124 may be treated to form lightly doped drain (LDD) regions 125, 126. Preferably, for NMOS transistors 102, Arsenic (As), Phosphorus (P) or Antimony (Sb) at an energy between about 5–50 KeV and a dosage between about $1.0 \times 10^{13}$ and $1.0 \times 10^{15}/cm^2$ and, for PMOS transistors, Boron or $BF_2$ at similar levels is used to form the LDD regions 125, 126. Thereafter, conventional techniques are used to complete the formation of the semiconductor structure.

Figure 4:
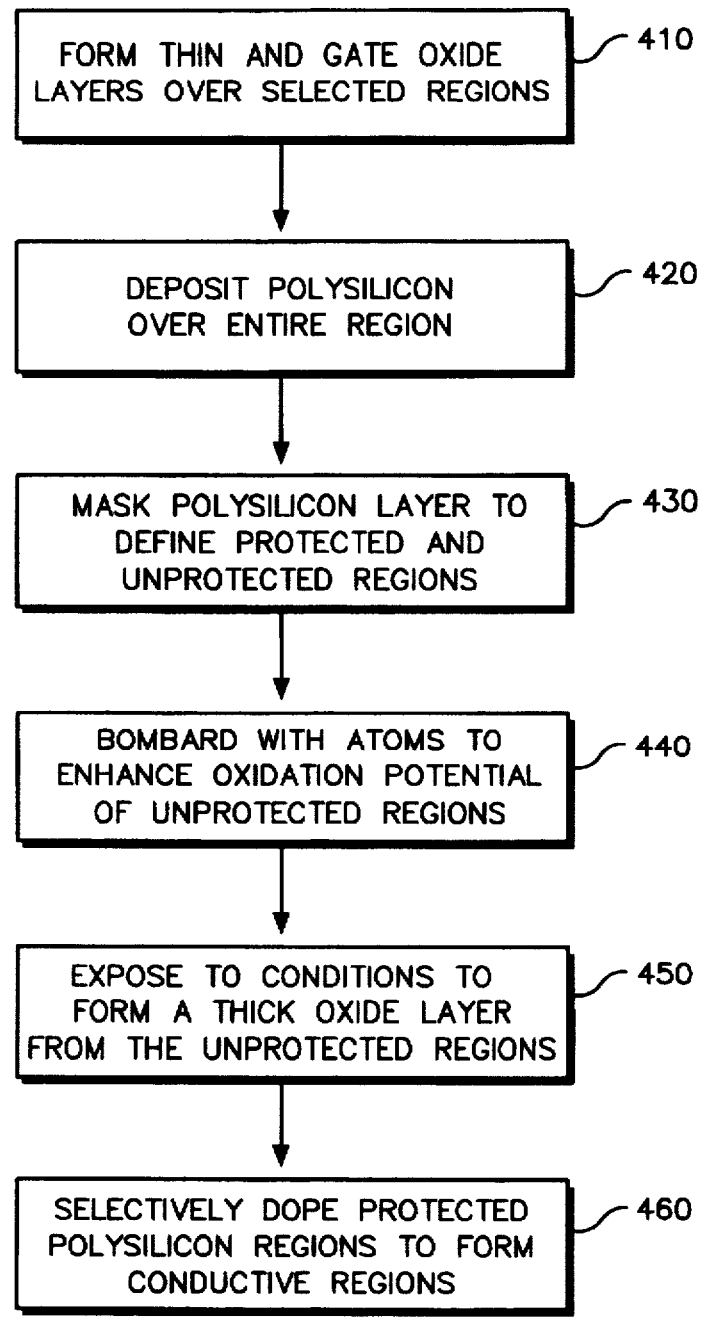
FIG. 4 is a flow chart illustrating the process for the formation of local interconnects in the fabrication of MOS transistors in accordance with the present invention.

Referring now to the flow chart of FIG. 4, there is shown a method for the formation of local interconnects according to the present invention. In conventional fashion, the thin oxide and gate oxide layers 106, 108 are selectively formed 410 on a semiconductor substrate 101. A layer of polysilicon 109 is formed 420 over the entire region and is then masked 430 to define corresponding protected 110 and unprotected 109 regions. The substrate is then bombarded with atoms 440 to enhance the oxidation potential of the unprotected regions. After removal of the mask, the region is exposed to oxidizing conditions 450 to convert the regions with enhanced oxidation potential 115 into a thick oxide layer 117 which isolates the various protected polysilicon regions 110 that are subsequently doped 460 to form conductive regions such as the gate electrodes 122, source 120 and drain 121 contact regions, and local interconnects 113. Conventional finishing steps are then used to complete the fabrication of the semiconductor structure.

The relative elevations of the thick oxide layer, the interconnects, the gate electrodes and the source and drain contact regions are controlled by selection of the thickness of the thin oxide, gate oxide and polysilicon layers, the parameters for bombardment and oxidation of the unprotected regions, and the etching of the surface and thick oxide layers. Thus, the process of forming local interconnects according to the present invention provides self-planarization. Additionally, the formation of the interconnects and other conductive regions from the same polysilicon layer reduces process steps and integrates the various regions, and the common elevation of the local interconnects facilitates making contact to them in subsequent processing.

I claim:

1. A method of forming local interconnects in the processing of a semiconductor device on a semiconductor substrate, the method comprising the steps of:

depositing polysilicon over a region of the substrate to form a polysilicon layer;

masking the polysilicon layer to define protected polysilicon regions and unprotected polysilicon regions, the protected polysilicon regions including protected subregions to be rendered conductive, the protected subregions including the local interconnects and the source and drain contact regions of a MOS transistor;

treating the substrate region to enhance the oxidation potential of the unprotected polysilicon regions;

after the step of treating the substrate region, exposing the substrate region to oxidizing conditions to form a thick oxide layer from the unprotected polysilicon regions;

doping the protected subregions to render them conductive, whereby the local interconnects are rendered conductive and prior to the step of depositing polysilicon, forming a thin oxide layer on areas of the substrate corresponding to the local interconnects, whereby the step of doping the protected polysilicon region commonly renders the local interconnects and the source and drain contact regions conductive, and the thin oxide layer forms and insulative layer between the substrate and the local interconnects but does not form an insulative layer between the substrate and the source and drain contact regions.

2. The method of claim 1, wherein the step of treating the substrate region includes bombarding the unprotected polysilicon regions with argon ions.

3. The method of claim 1, further comprising the step of:

selecting the step of depositing polysilicon and the step of exposing the substrate region to oxidizing conditions to control the relative thicknesses of the thick oxide layer and the protected polysilicon regions.

4. The method of claim 1, further comprising the step of:

prior to the step of depositing polysilicon, forming a thin oxide layer on the substrate, whereby an insulative layer is formed between the substrate and the local interconnects.

5. A method of forming local interconnects in the processing of a semiconductor device on a substrate, the method comprising the steps of:

forming a thin oxide layer on areas of a substrate region corresponding to the local interconnects;

depositing polysilicon over the substrate region to form a polysilicon layer;

masking the polysilicon layer to define protected polysilicon regions and unprotected polysilicon regions, the protected polysilicon regions including the local interconnects;

exposing the substrate region to oxidizing conditions to form a thick oxide layer from the unprotected polysilicon regions, the thick oxide layer providing selective isolation for the protected polysilicon regions; and doping the protected polysilicon regions corresponding to the local interconnects to render the local interconnects conductive, the thin oxide layer providing an insulative layer between the substrate and the local interconnects, wherein the protected polysilicon regions further include the source and drain contact regions of a MOS transistor, and the step of doping the protected polysilicon also renders the source and drain contact regions conductive, whereby the thin oxide layer provides an insulative layer between the substrate and the local interconnects but does not provide an insulative layer between the substrate and the source and drain contact regions.

6. The method of claim 5, further comprising the step of:

prior to the step of exposing the substrate region to oxidizing conditions, treating the unprotected polysilicon regions to enhance the oxidation potential of the unprotected polysilicon regions.

7. The method of claim 6, wherein the step of treating the substrate region includes bombarding the unprotected polysilicon regions with argon ions.

\* \* \* \* \*